(12) United States Patent
Ma et al.

(10) Patent No.: US 9,299,945 B2
(45) Date of Patent: Mar. 29, 2016

(54) TOP-EMITTING WHITE ORGANIC LIGHT-EMITTING DIODES HAVING IMPROVED EFFICIENCY AND STABILITY

(71) Applicant: NITTO DENKO CORPORATION, Ibaraki, Osaka (JP)

(72) Inventors: Liping Ma, San Diego, CA (US); Qianxi Lai, Vista, CA (US); Brett T. Harding, Carlsbad, CA (US); Shijun Zheng, San Diego, CA (US); Amane Mochizuki, Carlsbad, CA (US)

(73) Assignee: NITTO DENKO CORPORATION, Osaka (JP)

( * ) Notice: Subject to any disclaimer, the term of this patent is extended or adjusted under 35 U.S.C. 154(b) by 198 days.

(21) Appl. No.: 13/712,845

(22) Filed: Dec. 12, 2012

(65) Prior Publication Data

US 2013/0153871 A1    Jun. 20, 2013

Related U.S. Application Data

(60) Provisional application No. 61/570,667, filed on Dec. 14, 2011.

(51) Int. Cl.
    *H01L 51/50*      (2006.01)
    *H01L 51/56*      (2006.01)
    *H01L 51/00*      (2006.01)

(52) U.S. Cl.
    CPC .......... *H01L 51/504* (2013.01); *H01L 51/5004* (2013.01); *H01L 51/5044* (2013.01); *H01L 51/56* (2013.01); *H01L 51/0061* (2013.01); *H01L 51/0067* (2013.01); *H01L 51/0071* (2013.01); *H01L 51/0072* (2013.01); *H01L 51/0085* (2013.01); *H01L 2251/5376* (2013.01); *H01L 2251/558* (2013.01)

(58) Field of Classification Search
None
See application file for complete search history.

(56) References Cited

U.S. PATENT DOCUMENTS

| 6,984,934 B2 | 1/2006 | Möller et al. |
| 7,053,547 B2 | 5/2006 | Lu et al. |

(Continued)

FOREIGN PATENT DOCUMENTS

| EP | 1 670 082 | 6/2006 |
| EP | 2 133 932 | 12/2009 |

(Continued)

OTHER PUBLICATIONS

Deshpande, et al., "White-Light-Emitting Organic Electroluminescent Devices Based on Interlayer Sequential Energy Transfer," Aug. 16, 1999, Applied Physics Letters, vol. 75, No. 7, pp. 888-890.*
International Search Report and Written Opinion in PCT Application No. PCT/US2012/069132, dated Aug. 5, 2013.

(Continued)

*Primary Examiner* — Bilkis Jahan
*Assistant Examiner* — Kevin Quinto
(74) *Attorney, Agent, or Firm* — Knobbe, Martens, Olson & Bear, LLP

(57) ABSTRACT

The present disclosure relates to an emissive construct, which can be used in various OLED applications, for example, top-emission white organic light-emitting diodes. The emissive construct includes a fluorescent emissive layer, a partial hole-blocking layer, and a phosphorescent emissive. A recombination zone is shared between the fluorescent emissive layer and the phosphorescent emissive layer, such that the thickness of the partial hole-blocking layer is less than about one-third of the thickness of the recombination zone.

16 Claims, 3 Drawing Sheets

(56) References Cited

U.S. PATENT DOCUMENTS

| | | |
|---|---|---|
| 7,109,652 B2 | 9/2006 | Tsai et al. |
| 7,474,049 B2 | 1/2009 | Liu et al. |
| 2003/0198829 A1* | 10/2003 | Hoag et al. .................... 428/690 |
| 2004/0209116 A1* | 10/2004 | Ren et al. ...................... 428/690 |
| 2005/0123794 A1 | 6/2005 | Deaton et al. |
| 2007/0278455 A1* | 12/2007 | Park et al. ..................... 252/500 |
| 2008/0284318 A1* | 11/2008 | Deaton et al. ................. 313/504 |
| 2009/0091255 A1 | 4/2009 | Lee et al. |
| 2009/0115319 A1 | 5/2009 | Kim et al. |
| 2010/0187552 A1 | 7/2010 | Lee et al. |
| 2010/0314644 A1* | 12/2010 | Nishimura et al. ............. 257/98 |
| 2011/0062386 A1 | 3/2011 | Zheng et al. |
| 2011/0073853 A1* | 3/2011 | Smith ............................ 257/40 |
| 2012/0121933 A1 | 5/2012 | Ma et al. |

FOREIGN PATENT DOCUMENTS

| | | |
|---|---|---|
| WO | WO 2004/049465 | 6/2004 |
| WO | WO 2009/009695 | 1/2009 |
| WO | WO 2013/090355 | 6/2013 |

OTHER PUBLICATIONS

Birnstock et al., "Highly Efficient White Top-Emission PIN OLEDs for Display and Lighting," SID Symposium Digest of Technical Papers, May 2010, vol. 41, No. 1, pp. 774-777.

Kanno et al., "High-Efficiency Top-Emission White-Light-Emitting Organic Electrophosphorescent Devices," Applied Physics Letters, 2005, vol. 86, 263502.

Liu et al., "Microcavity Top-Emitting Organic Light-Emitting Devices Integrated with Diffusers for Simultaneous Enhancement of Efficiencies and Viewing Characteristics," Applied Physics Letters, 2009, vol. 94, 103302.

Riel et al., "Tuning the Emission Characteristics of Top-Emitting Organic Light-Emitting Devices by Means of a Dielectric Capping Layer: An Experimental and Theroretical Study," Journal of Applied Physics, Oct. 15, 2003, vol. 94, No. 8, pp. 5290-5296.

Sun et al., "Enhanced Light Out-Coupling of Organic Light-Emitting Devices Using Embedded Low-Index Grids," Nature Photonics, 2008, vol. 2, pp. 483-487.

Sun et al., "Management of Singlet and Triplet Excitons for Efficient White Organic Light-Emitting Devices", Nature, Apr. 2006, vol. 440, pp. 908-912.

* cited by examiner

TOP-EMITTING WHITE ORGANIC LIGHT-EMITTING DIODES HAVING IMPROVED EFFICIENCY AND STABILITY

CROSS-REFERENCE TO RELATED APPLICATIONS

This application claims the benefit of U.S. Provisional Patent Application No. 61/570,667, filed Dec. 14, 2011, which is incorporated by reference herein in its entirety.

BACKGROUND OF THE INVENTION

1. Field of the Invention

The present application relates to top-emission white-color organic light-emitting diode (OLED) devices for lighting applications.

2. Description of the Related Art

Organic light-emitting materials offer a very promising field of study for energy efficient lighting applications. Many methods have been proposed to increase the OLED device power efficiency, including modifying materials, device structure, device fabrication techniques, and light outcoupling techniques. A traditional OLED comprises a bottom emission type OLED (BE-OLED), wherein the bottom electrode is a transparent conducting metal oxide, such as Indium-Tin-Oxide (ITO) deposited on top of a transparent substrate, such as glass. Generally, without light outcoupling involved, most of the emitted light in a BE-OLED is trapped inside the device in the form of an organic mode, substrate mode, or plasma mode. Only about 10-30% of the light escapes from the device and contributes to the lighting. Thus, the light trapped in the glass substrate may account for 20% of the total emissive light. This generally requires light extraction in BE-OLEDs to be practically necessary.

Recently, top-emission OLED (TE-OLED) devices, wherein the top electrode (generally, the cathode) is either a semi-transparent metal cathode or a transparent conducting metal oxide like ITO, have been explored. For a semi-transparent top cathode, the microcavity effect may be serious due to a relatively higher reflectance of the metal semi-transparent cathode compared with a transparent ITO cathode. This can lead to selective wavelengths passing through the cathode, contributing to the light output and viewing angle dependence of the emission spectrum. While such a feature may be good for display applications, it can also negatively affect general lighting applications because white-color light emission is desired.

There are many challenging issues in TE-OLED manufacturing, including materials for the bottom reflective anode, the active cells of the light-emitting layers, and the semi-transparent cathode. Also, tuning the light enhancement layer and the light scattering layer, all while further enhancing the power efficiency of TE-OLED to meet various lighting application requirements, invokes large amounts of consideration. Compared to BE-OLED, the efficiency needs of TE-OLED require much more attention in order to meet the light application requirement.

SUMMARY OF THE INVENTION

An embodiment provides an emissive construct, which can be used in various OLED applications, for example, top-emission white organic light-emitting diodes. In some embodiments, the emissive construct comprises a fluorescent emissive layer comprising a first host material, a partial hole-blocking layer having a first thickness disposed on the fluorescent emissive layer, and a phosphorescent emissive layer disposed on the partial hole-blocking layer, comprising a second host material. In some embodiments, a recombination zone is shared between the fluorescent emissive layer and the phosphorescent emissive layer. In some embodiments, the recombination zone has a second thickness, wherein the first thickness of the partial hole-blocking layer is less than about one-third of the second thickness of the recombination zone.

DETAILED DESCRIPTION OF THE PREFERRED EMBODIMENT

The emissive constructs described herein can be used in various devices. In some embodiments, the emissive construct is used in an OLED. In some embodiments, the OLED comprising the emissive construct is selected from a BE-OLED or a TE-OLED. Preferably, the OLED comprising the emissive construct comprises a top-emission white OLED. OLEDs can be constructed of various known layers. In some embodiments, the OLED comprises an anode and a cathode. In some embodiments, the anode comprises a reflective anode. In some embodiments, the cathode comprises a semi-transparent or transparent cathode.

The layers that comprise emissive construct may be positioned in the device at various locations, though preferred embodiments are further described below. Preferably, the emissive construct comprises a fluorescent emissive layer, a partial hole-blocking layer adjacent to the fluorescent emissive layer, and a phosphorescent emissive layer adjacent to the partial hole-blocking layer. Furthermore, additional layers may also be present. For example, the OLED may comprise a substrate. In some embodiments, the OLED comprises an insulating layer. In some embodiments, the OLED comprises a hole-injection layer. In some embodiments, the OLED comprises a hole-transport layer. In some embodiments, the OLED comprises an electron transporting layer. In some embodiments, the OLED comprises an electron injection layer. In some embodiments, the OLE comprises a light emission enhancement layer. In some embodiments, the OLED comprises a light scattering layer.

Each of the layers in the OLED can be present in any order from bottom to top. Where a first layer is disposed over a second layer, the first and second layers can be, but need not be adjacent to one another. Where a first layer is disposed on a second layer, then the first layer is adjacent to the second layer. In some embodiments, the insulating layer is disposed over the substrate. In some embodiments, the reflective anode is disposed over the insulating layer. In some embodiments, the hole-injection layer is disposed over the reflective anode. In some embodiments, the hole-transport layer is disposed over the hole-injection layer. In some embodiments, the emissive construct is disposed over the hole-transport layer. In some embodiments, the electron transporting layer is disposed over the emissive construct. In some embodiments, the electron injection layer is disposed over the electron transporting layer. In some embodiments, the semi-transparent or transparent cathode is disposed over the electron transport layer. In some embodiments, the light emission enhancement layer is disposed over the semi-transparent or transparent cathode. In some embodiments, the light scattering layer is disposed over the light emission enhancement layer. Any layer that is disposed over another layer may or may not be adjacent to that other layer.

Figure 1:
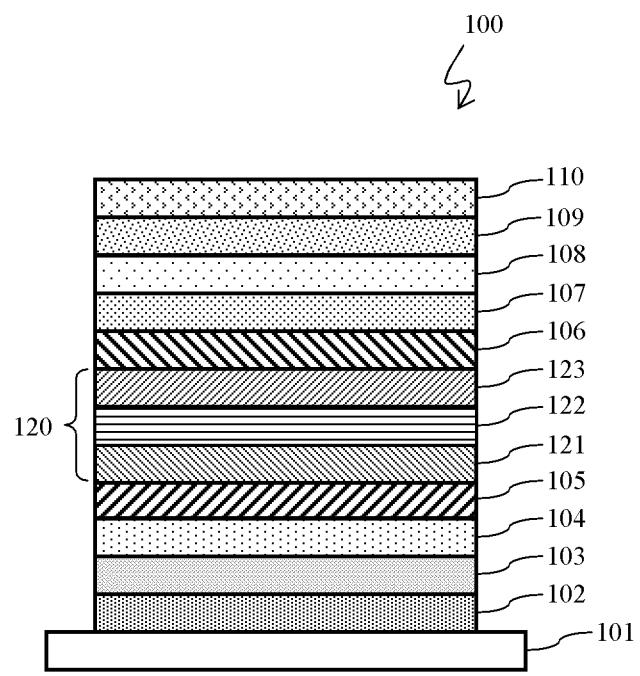
FIG. 1 shows an embodiment of the layers of a white TE-OLED device.

FIG. 1 depicts an example of a light-emitting device 100. In this embodiment, the light emitting device is a top-emitting white OLED, which emits light from the cathode side. The device comprises a transparent or opaque substrate 101, an insulating layer 102 disposed over the transparent or opaque substrate 101, a reflective or opaque anode 103 disposed over the insulating layer 102, a hole-injection layer (HIL) 104 disposed over the reflective or opaque anode 103, a hole-transport layer (HTL) 105 disposed over the HIL 104, and an emissive construct 110 disposed over the HTL.

In FIG. 1, the emissive construct 120 comprises three layers. First, a fluorescent emissive layer 121 comprising a first host material is disposed over the HTL 105. A partial hole-blocking layer 122 having is disposed over the fluorescent emissive layer 121 and a phosphorescent emissive layer 123 is disposed over the partial hole-blocking layer 122. A recombination zone includes the fluorescent emissive layer 121 and the phosphorescent emissive layer 123. The recombination zone is the area shared among the complimentary emissive layers where positive and negative charges are combined. In some embodiments, the fluorescent emissive layer 121 and the phosphorescent emissive layer 123 define the recombination zone. In some embodiments, the partial hole-blocking layer 122 has a thickness that is less than about one-third of the thickness of the recombination zone. The thickness of the recombination zone is defined by the combined thickness of all the emissive layers (e.g., fluorescent emissive layer 121 and the phosphorescent emissive layer 123).

As shown in FIG. 1, an electron-transport layer (ETL) 106 is disposed over the emissive construct 120, an electron injection layer (EIL) 107 is disposed over the ETL 106, a semi-transparent or transparent cathode 108 is disposed over the ETL 106, a light emission enhancement layer 109 is disposed over the semi-transparent or transparent cathode 108, and a light scattering layer 110 is disposed over the light emission enhancement layer 109.

In some embodiments, the fluorescent emissive layer 121 comprises a first host material. Various host materials can be utilized. For example, the first host material may be a fluorescent material, such as a blue light-emitting fluorescent material, that is capable of fluorescence without any fluorescent dopant. The fluorescent material may also be any material that is suitable as a host for a fluorescent dopant material. In some embodiments, the first host emits blue light. In some embodiments, the fluorescent emissive layer is undoped. For example, the first host material may include, but is not limited to, one or more of the following compounds:

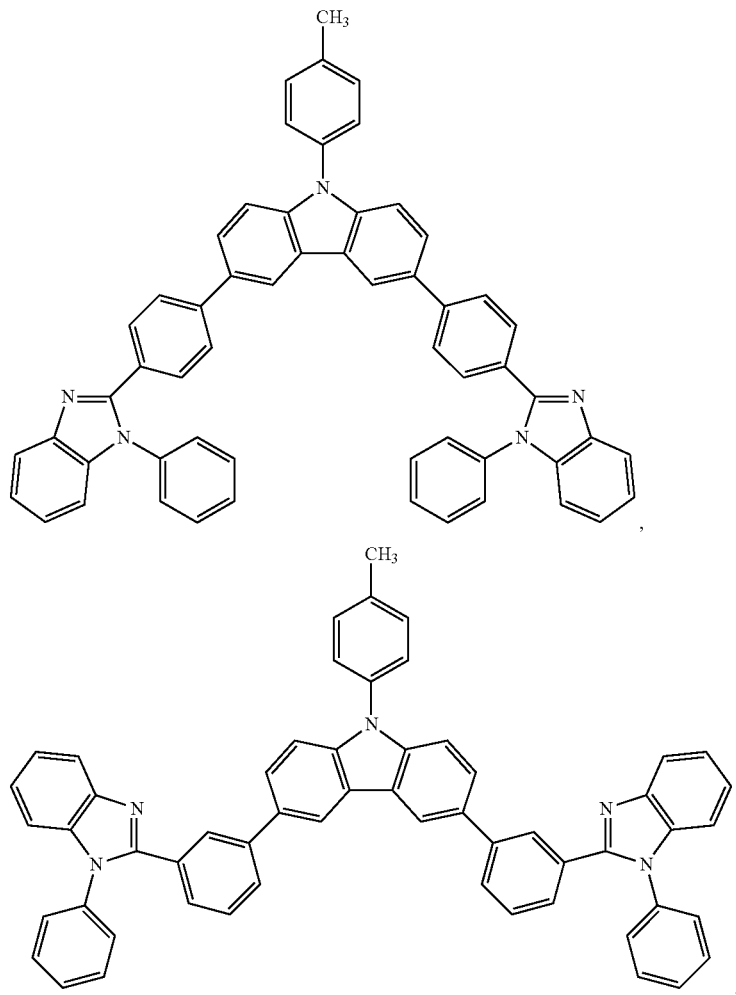

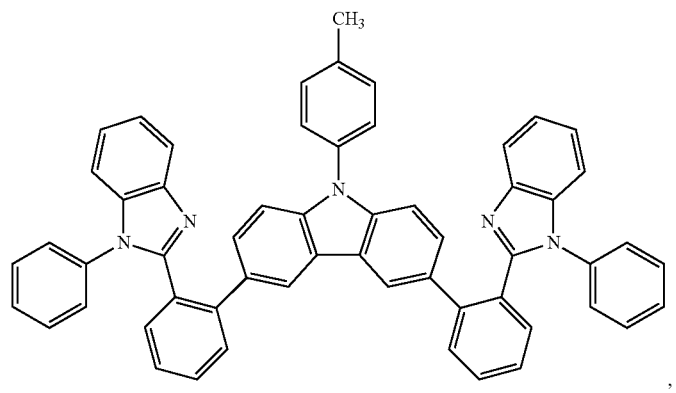
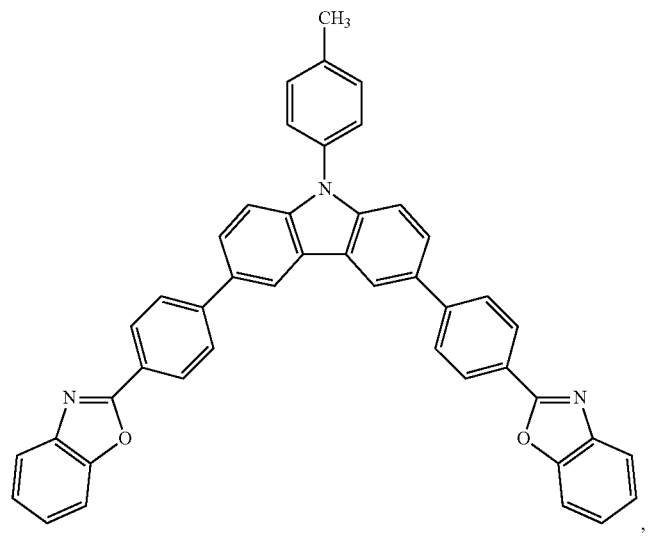
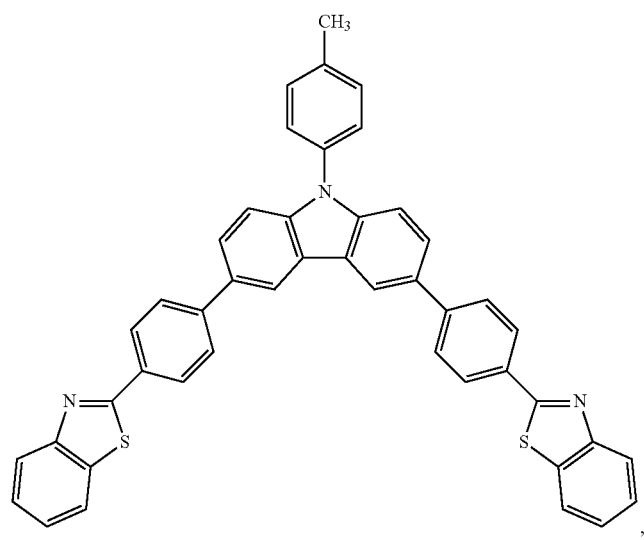

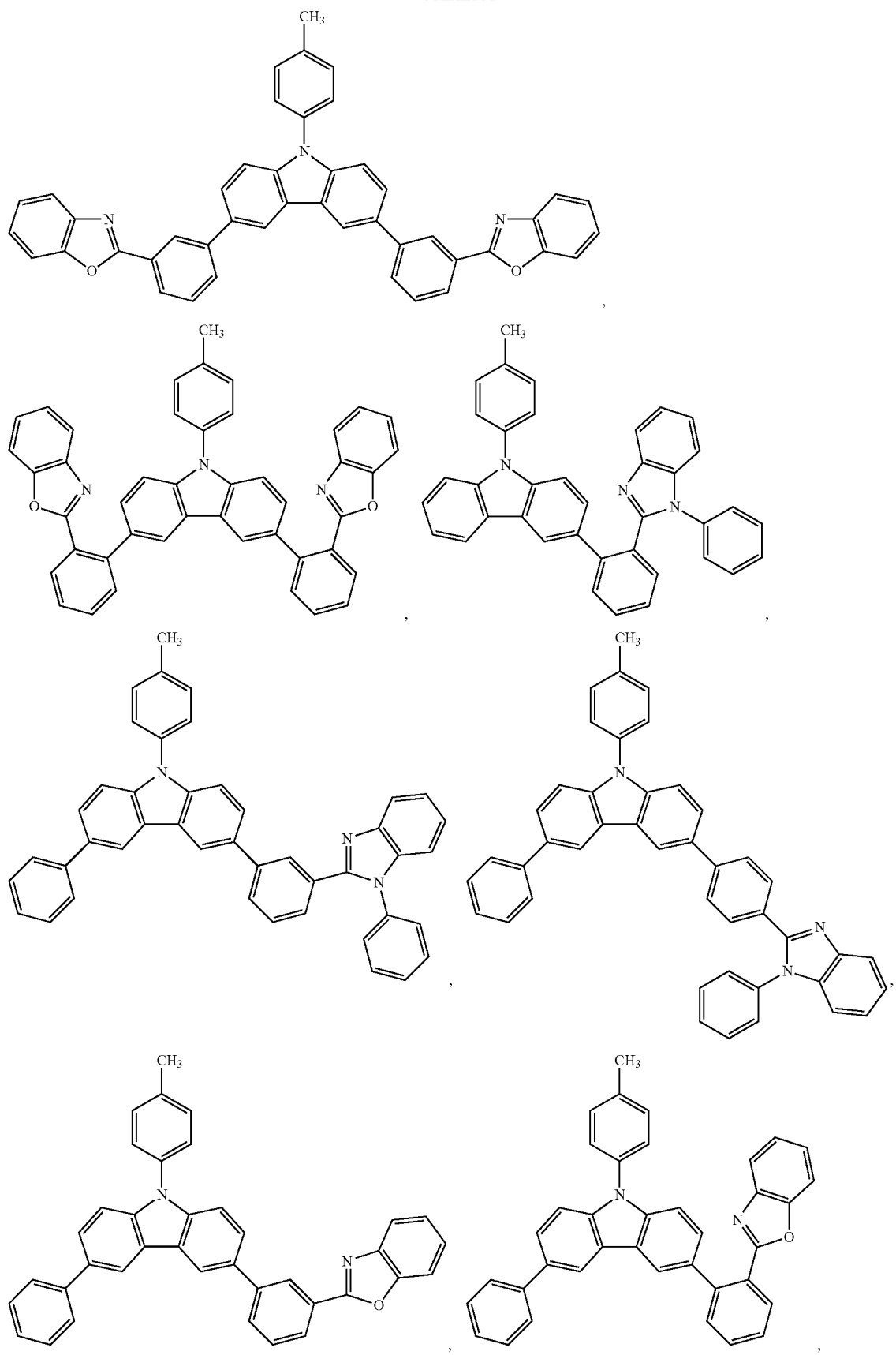

-continued
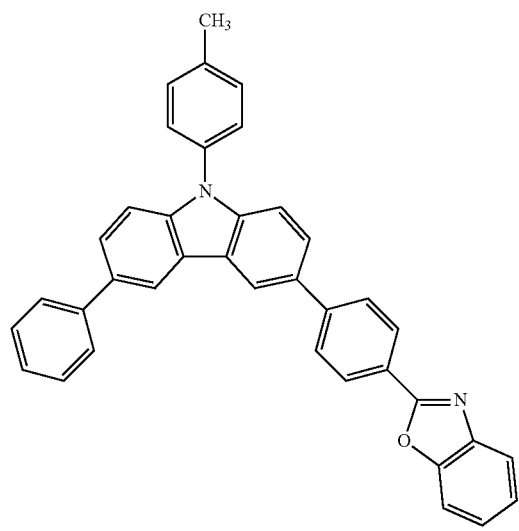,
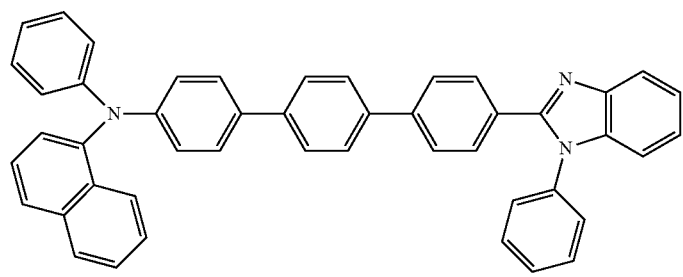,
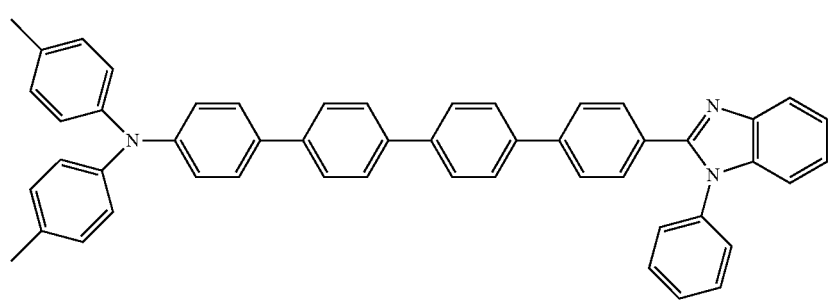,
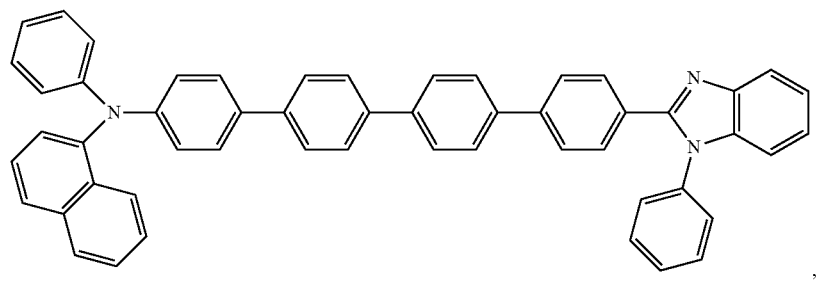, and
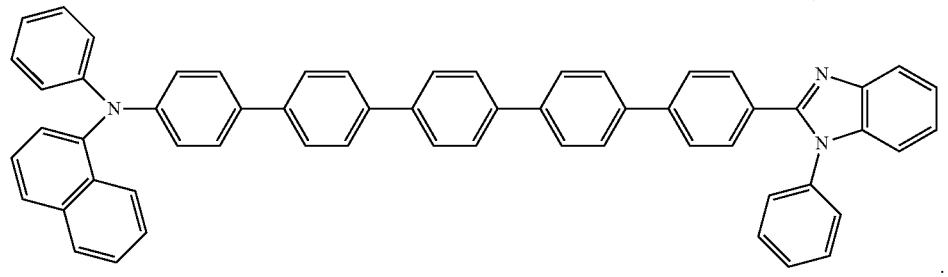.

In some embodiments, the host comprises a non-polymeric compound. In some embodiments, the host consists essentially of a non-polymeric compound. Compounds described in US 20110062386 and U.S. Provisional Patent Application No. 61/426,259, filed Dec. 22, 2010, both of which are incorporated by reference in their entirety, may also be used as first host materials.

In some embodiments, the fluorescent emissive layer comprises a blue light-emitting fluorescent dopant. In some embodiments, the blue-emitting fluorescent dopant materials have a T1 that is greater than about 2.3. For example, the blue light-emitting fluorescent dopant can be selected from the following compounds. The terms "T1," or "triplet energy," have the ordinary meaning understood by a person of ordinary skill in the art, and include the energy of the transition from lowest energy triplet state of an exciton to the ground state. There are many methods known in the art that may be used to obtain the triplet energy, such by obtaining phosphorescence spectrum.

| STRUCTURE | $T_1$ Vlaue |
|---|---|
| 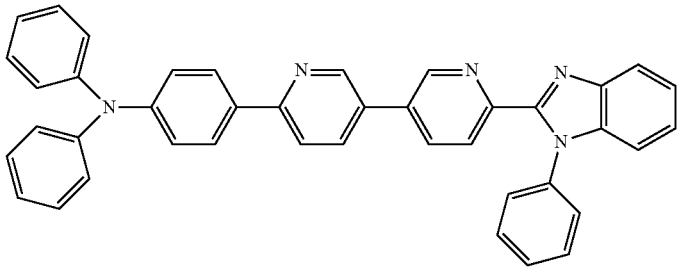 [SMILES: c1ccc(N(c2ccccc2)c2ccc(-c3ccc(-c4ccc(-c5nc6ccccc6n5-c5ccccc5)nc4)cn3)cc2)cc1] | 2.34 |
| 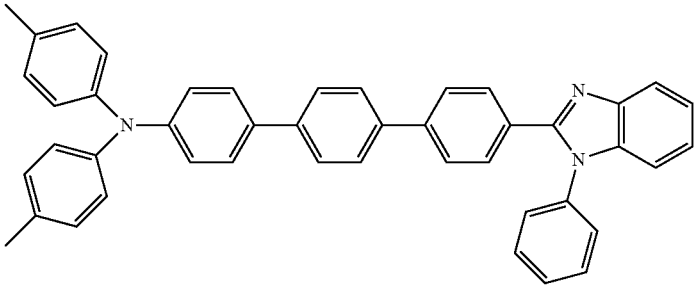 [SMILES: Cc1ccc(N(c2ccc(C)cc2)c2ccc(-c3ccc(-c4ccc(-c5nc6ccccc6n5-c5ccccc5)cc4)cc3)cc2)cc1] | 2.35 |
| 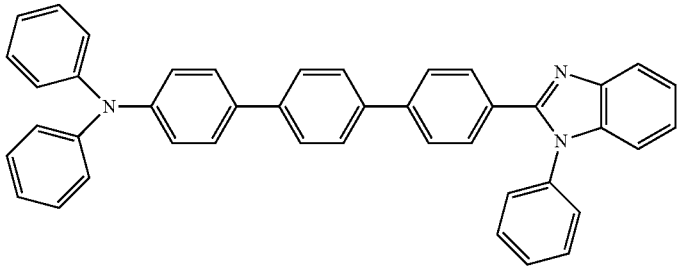 [SMILES: c1ccc(N(c2ccccc2)c2ccc(-c3ccc(-c4ccc(-c5nc6ccccc6n5-c5ccccc5)cc4)cc3)cc2)cc1] | 2.38 |
| 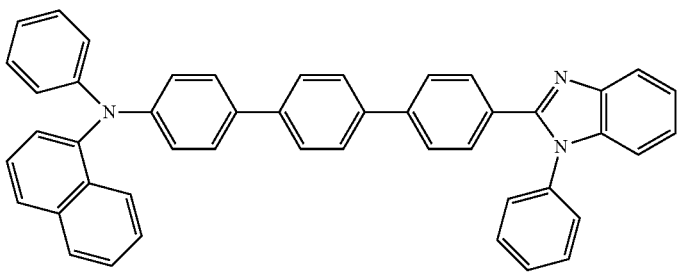 | 2.38 |

| STRUCTURE | T₁ Vlaue |
|---|---|
| (structure 2.36) | 2.36 |
| (structure 2.37) | 2.37 |

In some embodiments, the first host material has a S1 energy level that is higher than a S1 energy level of the blue light-emitting fluorescent dopant. As used herein, "S1" refers to the lowest energy excited singlet state of an exciton. As used herein, an "exciton" refers to molecule, an atom, or an associated group of molecules and/or atoms in an excited electronic state. A higher energy S1 of the first host material may allow an exciton of the host material to more readily transfer excited singlet energy to a lower S1 energy fluorescent dopant, as compared to a dopant that has a higher S1 energy than the first host material. Transferring excited singlet energy to the dopant provides a dopant in the S1 state, which can then fluoresce.

In some embodiments, the Host S1 is greater than the fluorescent blue emitter S1. In some embodiments, the Host T1 is greater than the phosphorescent blue emitter T1. In some embodiments, the Host T1 is less than the fluorescent blue emitter T1. In some embodiments, the first host material has a T1 that is lower than a T1 of the blue light-emitting fluorescent dopant. In some embodiments, the first host material has a singlet energy (S1) that is higher than a singlet energy (S1) of the blue light-emitting fluorescent dopant.

In some embodiments, the phosphorescent emissive layer is an orange-emitting layer. In some embodiments, the phosphorescent emissive layer comprises a second host material. Various host materials can be utilized in the phosphorescent emissive layer. In some embodiments, the second host in the phosphorescent emissive layer is the same as the first host in the fluorescent emissive layer. For example, the second host may comprise any of the compounds listed as options for the first host above. The second host may also be different than the first host. In some embodiments, the T1 of the first host in the fluorescent emissive layer is greater than the T1 of the second host in the phosphorescent emissive layer.

The phosphorescent emissive layer may also include one or more phosphorescent dopants. For example, the phosphorescent emissive layer may comprise a second host and one or more phosphorescent dopants, such as one or more phosphorescent dopants that are (1) yellow and red emitters, (2) green and red emitters, or (3) a single orange emitter. In some embodiments, the T1 of the phosphorescent second host is greater than the T1 of the one or more phosphorescent dopants.

In some embodiments, the phosphorescent emissive layer comprises a material or materials that emit(s) a complementary color light, such that the blue light emitted from the fluorescent blue emitting layer combines in whole or in part with the phosphorescent emission of the phosphorescent emissive layer to provide a perceived white light. In some embodiments, the second host of the phosphorescent emissive layer can be selected from the following compounds:

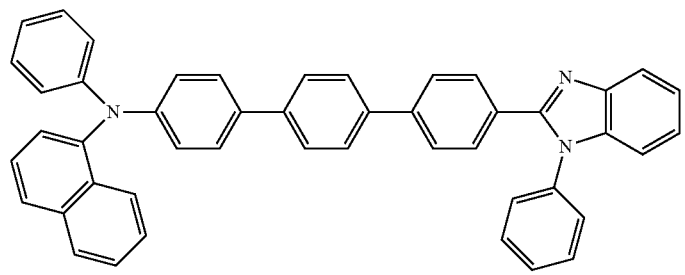 [SMILES: c1ccc(N(c2ccc(-c3ccc(-c4ccc(-c5nc6ccccc6n5-c5ccccc5)cc4)cc3)cc2)c2cccc3ccccc23)cc1]

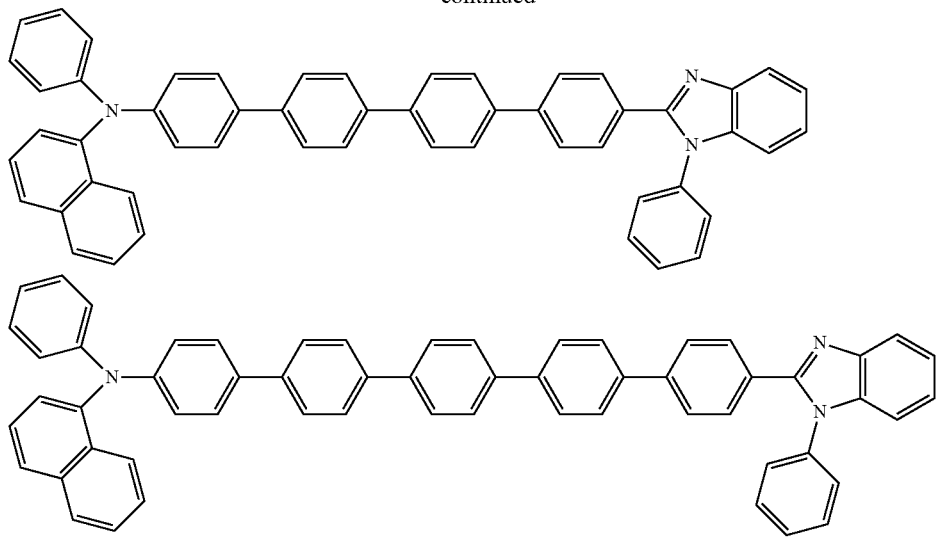

In some embodiments, the phosphorescent emissive layer may be a white-light creating complementary phosphorescent emitter. In some embodiments, the phosphorescent emissive layer can be a yellow emitting compound and a red emitting compound. In some embodiments, the yellow emitting compound can be YE-01.

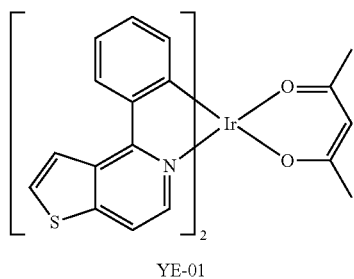

YE-01

In some embodiments, the red emitting compound can be Ir(piq)2acac.

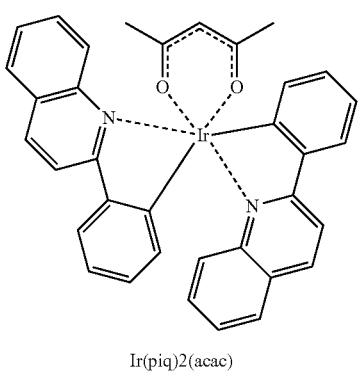

Ir(piq)2(acac)

Other appropriate complementary emitters can be selected from those described in U.S. patent application Ser. No. 13/293,537, filed Nov. 10, 2011 and U.S. Provisional Patent Application Nos. 61/449,032, filed Mar. 3, 2011, and 61/533,679, filed Sep. 12, 2011, the contents of each of which are incorporated by reference herein in their entirety.

The thicknesses of the fluorescent emissive layer and the phosphorescent emissive layer may vary. In some embodiments, the thickness of the fluorescent emissive layer is in the range of about 5 nm to about 50 nm. In some embodiments, the thickness of the fluorescent emissive layer is in the range of about 10 nm to about 50 nm. In some embodiments, the thickness of the fluorescent emissive layer is in the range of about 10 nm to about 40 nm. In some embodiments, the thickness of the fluorescent emissive layer is in the range of about 10 nm to about 30 nm. In some embodiments, the thickness of the phosphorescent emissive layer is in the range of about 5 nm to about 50 nm. In some embodiments, the thickness of the phosphorescent emissive layer is in the range of about 10 nm to about 50 nm. In some embodiments, the thickness of the phosphorescent emissive layer is in the range of about 10 nm to about 40 nm. In some embodiments, the thickness of the phosphorescent emissive layer is in the range of about 10 nm to about 30 nm. In some embodiments, the fluorescent emissive layer has a thickness of about 20 nm. In some embodiments, the phosphorescent emissive layer has a thickness of about 20 nm.

A partial hole-blocking layer is disposed between the fluorescent emissive layer and the phosphorescent emissive layer, acting as confinement of electron-hole recombination center, exhibiting color-stability with respect of applied voltage. Additionally, a recombination zone is shared between the fluorescent emissive layer and the phosphorescent emissive layer. Various materials can be used in the partial hole-blocking layer. Preferably, the T1 of the partial hole-blocking layer material is greater than both the T1 of the fluorescent host material and the T1 of the phosphorescent host material. In some embodiments, the HOMO value of the partial hole-blocking layer is more negative than the HOMO value of the fluorescent host material.

In some embodiments, the partial hole blocking layer can include, for example, materials having an 2-(4-biphenylyl)-5-(4-tert-butylphenyl)-1,3,4-oxadiazole (PBD), 1,3-bis(N, N-t-butyl-phenyl)-1,3,4-oxadiazole (OXD-7), 1,3-bis[2-(2, 2'-bipyridine-6-yl)-1,3,4-oxadiazo-5-yl]benzene (BPY-OXD), 2,9-dimethyl-4,7-diphenyl-phenanthroline (bathocuproine or BCP), and 1,3,5-tris[2-N-phenylbenzimidazol-z-yl]benzene (TPBI). In some embodiments, the partial hole-blocking layer allows about 50% to about 95% of the holes reaching the hole blocking layer to pass from the phosphorescent emissive layer to the fluorescent emissive layer. In some embodiments, the partial hole-blocking layer allows about 50% to about 95% of the holes reaching the hole blocking layer to pass from the fluorescent emissive layer to the phosphorescent emissive layer.

Preferably, the partial hole-blocking layer has a thickness that is less than about one-third of the thickness of the recombination zone. In some embodiments, the thickness of the partial hole-blocking layer is in the range of about 0.5 nm to about 3 nm. In some embodiments, the thickness of the recombination zone is in the range of about 2 nm to about 40 nm, about 2 nm to about 30 nm, or about 2 nm to about 20 nm. In some embodiments, the thickness of the recombination zone is in the range of about 5 nm to about 15 nm. In some embodiments, the thickness of the recombination zone is in the range of about 8 nm to about 12 nm. In some embodiments, the thickness of the recombination zone is about 10 nm.

Another embodiment provides a method for color tuning a top-emission white organic light-emitting diode. In some embodiments, the method comprises inserting a partial hole-blocking layer having a first thickness, as described herein, between a fluorescent emissive layer and a phosphorescent emissive layer, and adjusting the first thickness to tune the color of the top-emission white organic light-emitting diode. The fluorescent emissive layer and the phosphorescent emissive layer combined has a second thickness. In some embodiments, the method comprises thickening the hole-blocking layer (increasing the first thickness) to provide a blue shift. In some embodiments, the method comprises thinning the hole-blocking layer (decreasing the first thickness) to provide a red shift.

The cathode layer can be a semi-transparent metal electrode comprising metal alloys (such as Mg:Ag mixture), a bi-layer structure (such as Ca/Au), or a transparent electrode (such as ITO, Al:ZnO). The cathode can also comprise transparent and conducting carbon materials (such as CNT, grapheme). The light enhancement layer can comprise transparent materials, which may comprise both organic small molecule materials and inorganic materials including metal oxide, or wide band gap semiconductor compounds (band gap larger than blue light, wavelength shorter than 450 nm). The light scattering layer may comprise a thermal deposited porous nano-structured film.

The hole injection layer can comprise transition metal oxide. In some embodiments, the reflective-opaque anode comprises an Ag and Al bi-layer. The hole-transport layer can be partially p-doped and the electron-transport layer can be partially n-doped. The partially doped means there are still certain thickness of the transport layer undoped close to the original layer.

In some embodiments, a white light emitting OLED device is provided which can include, in sequence from bottom to top, a substrate, an insulating layer coated on top of the substrate; a reflective and opaque anode above the insulating layer; a hole injection layer above the anode; a hole transport layer above the hole injection layer; the emissive construct described above; an electron transporting layer above the emissive construct; an electron injection layer above the electron transporting layer; a semitransparent or transparent cathode above the electron transport layer, a light emission enhancement layer above the cathode; and a light scattering layer disposed above the light emission enhancement layer. The materials of the substrate, the insulating layer, the reflective and opaque anode, the hole injection layer, the hole transport layer, the electron transporting layer, the electron injection layer, the semitransparent or transparent cathode, the light emission enhancement layer, and the light scattering layer are further described in U.S. Provisional Patent Application No. 61/533,679, filed Sep. 12, 2011, which is further incorporated by reference in its entirety herein, particularly for the discussion of these types of OLED layers.

For lighting application, top-emission white organic light emitting diode has the issue of lower efficiency and color changing with viewing angles, and complex device structure. This invention, considering overall device design and materials selected for each layer of the device, solved these issues and achieved: simple device structure, easy processing, all the device fabrication done through thermal deposition, new world record in the device power efficiency with white color meeting the DOE general lighting requirement and insensitive color respect to different viewing angles.

In some embodiments, the invention may provide a method for color tuning a white light emitting hybrid OLED device emit a colder (more blue) light which can include inserting the emissive construct described above between an anode and a cathode; and thickening the HBL layer a sufficient distance to provide the desired blue shift.

In some other embodiments, the invention may provide a method for color tuning a white light emitting hybrid OLED device to emit a warmer (more red/orange light) light comprising inserting the emissive construct described above between an anode and a cathode; and adjusting the HBL layer a sufficient distance (thickness) to provide the desired blue/red shift.

Some embodiments provides an emissive construct, which can be used in various OLED applications, for example, top-emission white organic light-emitting diodes. In some embodiments, the emissive construct comprises a fluorescent emissive layer comprising a first host material, a partial hole-blocking layer having a first thickness disposed on the fluorescent emissive layer, and a phosphorescent emissive layer disposed on the partial hole-blocking layer, comprising a second host material. In some embodiments, a recombination zone is shared between the fluorescent emissive layer and the phosphorescent emissive layer, and is defined as including the fluorescent emissive layer and the phosphorescent emissive layer. The thickness of the recombination zone is defined as the combined thickness of the fluorescent emissive layer and the phosphorescent emissive layer. In some embodiments, the recombination zone has a second thickness, wherein the first thickness of the partial hole-blocking layer is less than about one-third of the second thickness.

In some embodiments, the phosphorescent emissive layer comprises a phosphorescent dopant, wherein the light emitted by the phosphorescent dopant provides white light when combined with the light emitted by the fluorescent emissive layer. In some embodiments, the phosphorescent emissive layer comprises a yellow-emitting phosphorescent dopant and a red-emitting phosphorescent dopant. In some embodiments, both the fluorescent emissive layer and the phosphorescent emissive layer are about 20 nm thick. In some embodiments, a highest occupied molecular orbital of the hole-blocking layer has a higher energy than a highest occupied molecular orbital of the first host material.

In some embodiments, the yellow-emitting phosphorescent dopant and the red-emitting phosphorescent dopant do not need to be included in the same phosphorescent emissive layer. In those embodiments, the phosphorescent emissive layer of the emissive construct may further comprise two sub-layers. The first sub-layer comprises a yellow-emitting phosphorescent dopant and the second sub-layer comprises a red-emitting phosphorescent dopant, or vice versa. In some embodiments, the host of each of the sub-layers may be the same. In some embodiments, the two sub-layers may have different hosts.

EXAMPLES

It has been discovered that embodiments of top-emission while OLEDs produced using the systems and methods disclosed above can achieve simple device structure and easier processing. The OLEDs can be manufactured using thermal deposition and provide improved device power efficiency. These benefits are further shown by the following examples, which are intended to be illustrative of the embodiments of the disclosure, but are not intended to limit the scope or underlying principles in any way.

Example 1

Device Fabrication

Pre-cleaned glass substrates were baked at about 200° C. for about 1 hour under ambient environment, then under UV-ozone treatment for about 30 minutes. Then, a poly methyl methacrylate (PMMA) layer (about 180 nm thick) was spin-coated on top of the surface of the glass substrates (solution: 2 wt % PMMA in di-chloro benzene [DCB] solvent) at about 6000 RPM for about 40 seconds. The substrates were then baked at about 120° C. for about 2 hours. The substrates were loaded into a deposition chamber. A bi-layer reflective bottom anode, (50 nm Al layer and 50 nm Ag layer) was deposited sequentially, first Al then Ag, at a rate of about 2 Å/s. Molybdenum oxide ($MoO_3$, about 10 nm) was deposited as a hole-injecting layer at deposition rate of about 1 Å/s. Then a p-doping layer (20 nm), $MoO_3$ was co-deposited with 4,4'-bis[N-(naphthyl)-N-phenyl-amino]biphenyl (NPB) at 5% in volume ratio at the deposition rate of about 0.051 Å/s and about 1 Å/s for $MoO_3$ and NPB, respectively. A layer of NPB (about 20 nm) was then deposited as a hole-transport layer. A fluorescent blue emissive layer (20 nm) was then deposited having a fluorescent blue emitter (BE-1) that was co-deposited with a host material (Host-1) at 10% in volume with the deposition rate of about 0.1 Å/s for BE-1 and about 1 Å/s for Host-1.

(Host-1) with yellow emitter (YE-1) and red emitter ($Ir(pq)_2$ acac) at the deposition rate of about 1 Å/s for Host-1, about 0.05 Å/s for YE-1, and about 0.005 Å/s for $Ir(pq)_2acac$.

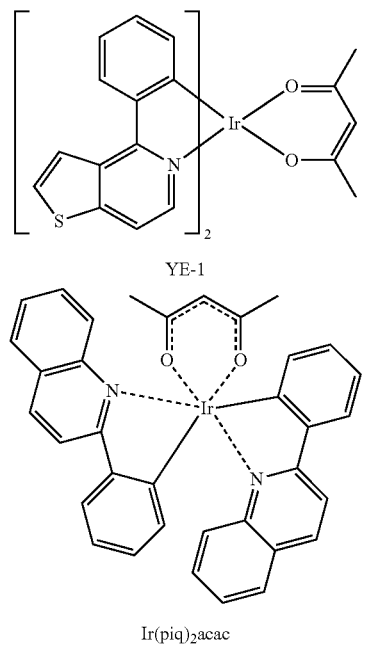

YE-1

$Ir(piq)_2acac$

The doping concentration of the yellow emitter and the red emitter were about 5% and about 0.5% by volume, respectively. Next, an electron transport layer (ETL) of about 30 nm was deposited at the deposition rate of about 1 Å/s. The

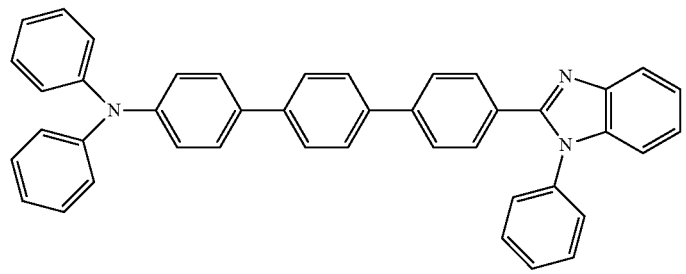

BE-1

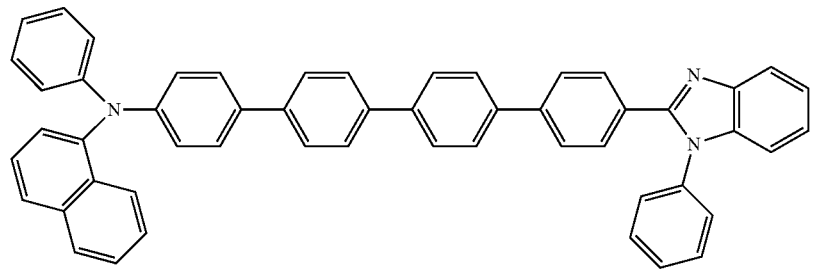

Host-1

Then, a partial hole blocking layer of 1,3,5-Tris(1-phenyl-1H-benzimidazol-)2-yl)benzene (TPBI) was deposited on top of the fluorescent blue emissive layer at about 0.1 Å/s for a thickness of about 2 nm. Then deposition of the phosphorescent emissive layer (20 nm) of three co-deposition of host electron injection layer (EIL) was then deposited as a thin layer of lithium fluoride (LiF, 1 nm thick, deposition rate 0.1 Å/s) and a thin layer of magnesium (Mg, 1 nm thick) at about 0.1 Å/s. A semi-transparent cathode (about 21 nm) was deposited by co-deposition of magnesium (Mg) and silver (Ag) at a ratio of about 1:2 by volume. A light enhancement layer of MoO$_3$ (70 nm) was deposited on top of the cathode. Finally a light scatter layer (3,5-bis(3-(benzo[d]oxazol-2-yl) phenyl)pyridine) was deposited on top of the light enhancement layer at deposition rate of about 2 Å/s for 900 nm. All the deposition was done at a base pressure of about 2×10$^{-7}$ torr. The device area was approximately 7.7 mm$^2$.

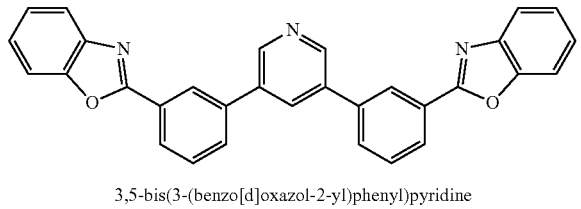 [SMILES: c1cc(-c2cncc(-c3cccc(-c4nc5ccccc5o4)c3)c2)cc(-c2nc3ccccc3o2)c1]

3,5-bis(3-(benzo[d]oxazol-2-yl)phenyl)pyridine

Figure 2:
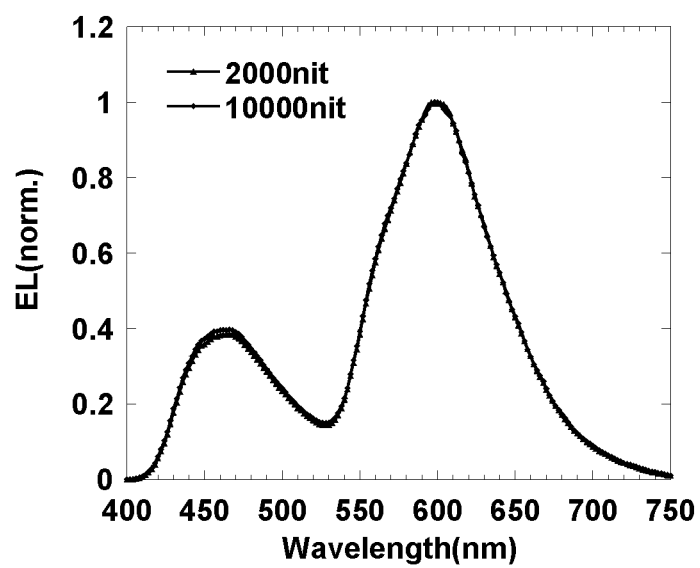
FIG. 2 shows the electroluminescence (EL) spectrum of an embodiment of a white TE-OLED device at lower (2000 nit) and higher (10000 nit) brightness levels.

The electroluminescence spectrum of Example 1 was measured. FIG. 2 shows an EL spectrum of the TE-WOLED of current invention at lower (2000 nit) and higher brightness (10000 nit) with CIE(0.44, 0.36), CRI(65). As shown in FIG. 2, the hole-blocking layer effectively confines the charge recombination center at the interface between the orange and blue emissive layers, giving stable emissive color at higher brightness.

Figure 3:
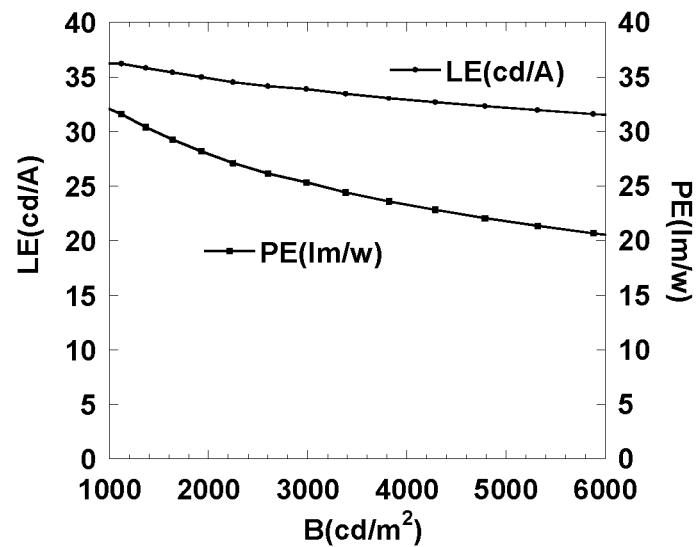
FIG. 3 shows the brightness dependence of current efficiency and power efficiency of an embodiment of a white TE-OLED device.

The brightness dependence of the current efficiency and power efficiency of Example 1 was also measured. FIG. 3 shows the brightness dependence of current efficiency and power efficiency of an embodiment of a white TE-OLED device.

Figure 4:
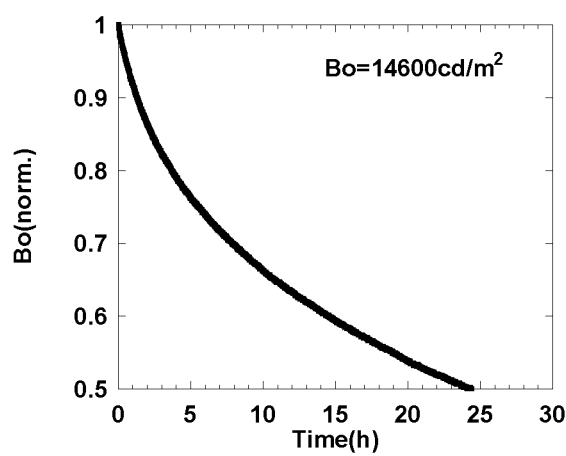
FIG. 4 shows the brightness level over the lifetime of an embodiment of a white TE-OLED device.
Figure 5:
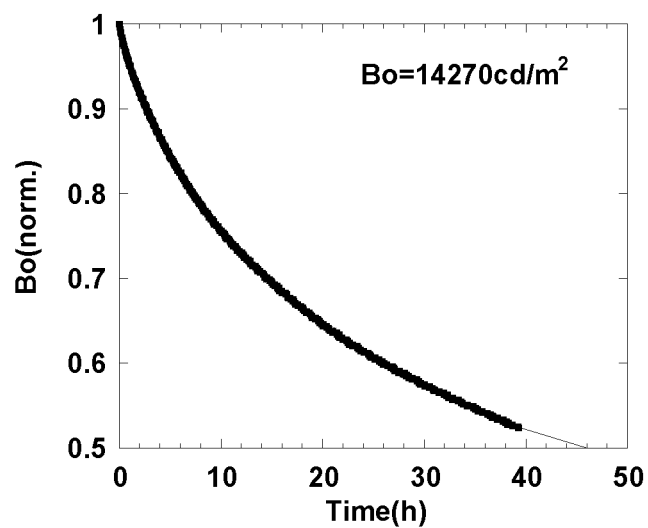
FIG. 5 shows the brightness level over the lifetime of an embodiment of another white TE-OLED device.

FIG. 4 shows the brightness level over the lifetime of a device in accordance with Example 1, except the substrate was PEDOT coated with ITO/Glass. FIG. 5 shows the brightness level over the lifetime of Example 1. As shown in FIGS. 4 and 5, the device lifetime and stability is improved using the more simplified substrate of PMMA coated with glass.

Although the subject matter of the claims have been disclosed in the context of certain embodiments and examples, it will be understood by those skilled in the art that the scope of the claims extends beyond the specifically disclosed embodiments to other alternative embodiments and/or uses of the invention and obvious modifications and equivalents thereof. Thus, it is intended that the scope of the present claims should not be limited by the particular disclosed embodiments described above.

What is claimed is:

1. A top-emission white organic light-emitting diode (OLED) comprising an emissive construct, wherein the emissive construct comprises:
 a fluorescent emissive layer comprising a first host material that emits blue light, wherein the fluorescent emissive layer is undoped;
 a phosphorescent emissive layer comprising a second host material;
 a partial hole-blocking layer having a first thickness disposed between the fluorescent emissive layer and phosphorescent emissive layer;
 wherein the fluorescent emissive layer and the phosphorescent emissive layer define a recombination zone having a second thickness; and
 wherein the first thickness is less than about one-third of the second thickness.

2. The top-emission white OLED according to claim 1, wherein the first thickness is in the range of 0.5 nm to 3 nm.

3. The top-emission white OLED according to claim 1, wherein the partial hole-blocking layer allows about 50% to about 95% of the holes reaching the hole blocking layer to pass from the phosphorescent emissive layer to the fluorescent emissive layer, or allows about 50% to about 95% of the holes reaching the hole blocking layer to pass from the fluorescent emissive layer to the phosphorescent emissive layer.

4. The top-emission white OLED according to claim 1, wherein both the fluorescent emissive layer and the phosphorescent emissive layer are 20 nm thick.

5. The top-emission white OLED according to claim 1, wherein a highest occupied molecular orbital of the partial hole-blocking layer has a higher energy than a highest occupied molecular orbital of the first host material.

6. The top-emission white OLED according to claim 1, further comprising an anode and a cathode, wherein the emissive construct is positioned between the anode and the cathode.

7. The top-emission white OLED according to claim 6, further comprising:
 a hole-injection layer disposed over the anode;
 a hole-transport layer disposed over the hole-injection layer;
 wherein the emissive construct is over the hole-transport layer;
 an electron transporting layer disposed over the emissive construct;
 an electron injection layer disposed on the electron transporting layer; and
 wherein the cathode is disposed on the electron transport layer.

8. A top-emission white organic light-emitting diode (OLED) comprising an emissive construct, wherein the emissive construct comprises:
 a fluorescent emissive layer comprising a first host material that emits blue light and a blue light-emitting fluorescent dopant;
 a phosphorescent emissive layer comprising a second host material;
 a partial hole-blocking layer having a first thickness disposed between the fluorescent emissive layer and phosphorescent emissive layer;
 wherein the fluorescent emissive layer and the phosphorescent emissive layer define a recombination zone having a second thickness; and
 wherein the first thickness is less than about one-third of the second thickness, and a highest occupied molecular orbital of the partial hole-blocking layer has a higher energy than a highest occupied molecular orbital of the first host material.

9. The top-emission white OLED according to claim 8, where the first host material has a T1 that is lower than a T1 of the blue light-emitting fluorescent dopant.

10. The top-emission white OLED according to claim 8, where the first host material has a S1 energy level that is higher than a S1 energy level of the blue light-emitting fluorescent dopant.

11. The top-emission white OLED according to claim 8, wherein both the fluorescent emissive layer and the phosphorescent emissive layer are 20 nm thick.

12. The top-emission white OLED according to claim 8, further comprising an anode and a cathode, wherein the emissive construct is positioned between the anode and the cathode.

13. The top-emission white OLED according to claim 12, further comprising:
 a hole-injection layer disposed over the anode;

a hole-transport layer disposed over the hole-injection layer;
wherein the emissive construct is over the hole-transport layer;
an electron transporting layer disposed over the emissive construct;
an electron injection layer disposed on the electron transporting layer; and
wherein the cathode is disposed on the electron transport layer.

14. A top-emission white organic light-emitting diode (OLED) comprising:
an emissive construct, wherein the emissive construct comprises:
a fluorescent emissive layer comprising a first host material;
a phosphorescent emissive layer comprising a second host material, a yellow-emitting phosphorescent dopant, and a red-emitting phosphorescent dopant;
a partial hole-blocking layer having a first thickness disposed between the fluorescent emissive layer and phosphorescent emissive layer;
wherein the fluorescent emissive layer and the phosphorescent emissive layer define a recombination zone having a second thickness;
wherein the first thickness is less than about one-third of the second thickness; and
wherein the light emitted by the phosphorescent dopant provides white light when combined with the light emitted by the fluorescent emissive layer
an anode and a cathode, wherein the emissive construct is positioned between the anode and the cathode;
a hole-injection layer disposed over the anode;
a hole-transport layer disposed over the hole-injection layer;
wherein the emissive construct is over the hole-transport layer;
an electron transporting layer disposed over the emissive construct;
an electron injection layer disposed on the electron transporting layer; and
wherein the cathode is disposed on the electron transport layer.

15. The top-emission white OLED according to claim 14, wherein the phosphorescent emissive layer further comprises a first sub-layer and a second sub-layer, wherein the first sub-layer comprises the yellow-emitting phosphorescent dopant and the second sub-layer comprises the red-emitting phosphorescent dopant.

16. The top-emission white OLED according to claim 14, wherein a highest occupied molecular orbital of the partial hole-blocking layer has a higher energy than a highest occupied molecular orbital of the first host material.

* * * * *